(12) United States Patent
Roberts et al.

(10) Patent No.: US 6,744,134 B2
(45) Date of Patent: Jun. 1, 2004

(54) USE OF A REFERENCE FIDUCIAL ON A SEMICONDUCTOR PACKAGE TO MONITOR AND CONTROL A SINGULATION METHOD

(75) Inventors: Jay Roberts, Meridian, ID (US); Gregory M. Chapman, Meridian, ID (US); John VanNortwick, Kuna, ID (US); Zane Drussel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/037,205

(22) Filed: Jan. 4, 2002

(65) Prior Publication Data

US 2002/0058396 A1 May 16, 2002

Related U.S. Application Data

(62) Division of application No. 09/653,473, filed on Aug. 31, 2000.

(51) Int. Cl.⁷ .................. H01L 23/043; H01L 23/544
(52) U.S. Cl. .............................. 257/708; 257/797
(58) Field of Search .................. 408/401, 462, 408/708; 257/797

(56) References Cited

U.S. PATENT DOCUMENTS

| 4,478,352 A | 10/1984 | Amundson et al. ............ 221/13 |
| 4,973,948 A | 11/1990 | Roberts ....................... 340/653 |
| 4,977,993 A | 12/1990 | Chapman ...................... 193/45 |
| 5,279,975 A | 1/1994 | Devereaux et al. ............ 437/8 |
| 5,375,320 A | 12/1994 | Kinsman et al. .............. 29/827 |
| 5,483,741 A | 1/1996 | Akram et al. ................. 29/846 |
| 5,496,777 A | 3/1996 | Moriyama .................. 437/249 |
| 5,641,113 A | 6/1997 | Somaki et al. ......... 228/180.22 |
| 5,668,061 A | 9/1997 | Herko et al. ................ 438/463 |

(List continued on next page.)

OTHER PUBLICATIONS

Iscoff, Ron, *Singulation Trends: Automation and Integration Are the Order of the Day*, Chip Scale Review, Sep./Oct. 2000 pp. 51–57.

*Primary Examiner*—W. David Coleman
*Assistant Examiner*—William M. Brewster
(74) *Attorney, Agent, or Firm*—Whyte Hirschboeck Dudek SC

(57) ABSTRACT

A semiconductor package singulation process is disclosed. The process comprises the step of using at least a portion of a reference fiducial formed on at least one package in a semiconductor package panel comprising a plurality of interconnected packages, the fiducial used to monitor and to control the semiconductor package singulation process.

25 Claims, 3 Drawing Sheets

U.S. PATENT DOCUMENTS

| | | | |
|---|---|---|---|
| 5,674,785 A | 10/1997 | Akram et al. | 437/217 |
| 5,703,303 A | 12/1997 | Stewart | 73/866.4 |
| 5,703,402 A | 12/1997 | Chu et al. | 257/737 |
| 5,716,889 A | 2/1998 | Tsuji et al. | 438/401 |
| 5,729,894 A | 3/1998 | Rostoker et al. | 29/832 |
| 5,777,392 A | 7/1998 | Fujii | 257/797 |
| 5,831,445 A | 11/1998 | Atkins et al. | 324/760 |
| 5,849,441 A * | 12/1998 | Nara et al. | 430/22 |
| 5,859,707 A | 1/1999 | Nakagawa et al. | 356/401 |
| 5,872,051 A | 2/1999 | Fallon et al. | 438/616 |
| 5,880,590 A | 3/1999 | Desai et al. | 324/757 |
| 5,904,555 A | 5/1999 | Darbha et al. | 438/613 |
| 5,923,995 A | 7/1999 | Kao et al. | 438/460 |
| 5,942,805 A | 8/1999 | Winer et al. | 257/797 |
| 5,961,722 A | 10/1999 | Buhrer et al. | 118/712 |
| 6,001,703 A | 12/1999 | Winer et al. | 438/401 |
| 6,006,739 A | 12/1999 | Akram et al. | 125/23.01 |
| 6,011,694 A | 1/2000 | Kirakawa | 361/774 |
| 6,012,502 A | 1/2000 | VanNortwick et al. | 156/518 |
| 6,013,535 A | 1/2000 | Moden et al. | 438/15 |
| 6,018,249 A | 1/2000 | Akram et al. | 324/758 |
| 6,020,218 A | 2/2000 | Shim et al. | 438/111 |
| 6,025,212 A | 2/2000 | VanNortwick et al. | 438/111 |
| 6,040,702 A | 3/2000 | Hembree et al. | 324/755 |
| 6,043,670 A | 3/2000 | Degani et al. | 324/765 |
| 6,047,470 A | 4/2000 | Drussel et al. | 29/847 |
| 6,048,744 A | 4/2000 | Corisis et al. | 438/15 |
| 6,048,755 A | 4/2000 | Jiang et al. | 438/118 |
| 6,049,974 A | 4/2000 | Asanasavest | 29/832 |
| 6,049,977 A | 4/2000 | Atkins et al. | 29/843 |
| 6,054,338 A | 4/2000 | Lee et al. | 438/110 |
| 6,072,236 A | 6/2000 | Akram et al. | 257/698 |
| 6,072,700 A | 6/2000 | Nam | 361/783 |
| 6,078,506 A | 6/2000 | Sugahara | 361/783 |
| 6,081,040 A * | 6/2000 | Okuda et al. | 257/797 |
| 6,083,820 A | 7/2000 | Farnworth | 438/614 |
| 6,084,311 A | 7/2000 | Jiang et al. | 257/782 |
| 6,096,165 A | 8/2000 | Chapman | 156/433 |
| 6,101,148 A | 8/2000 | Okamura et al. | 365/230.06 |
| 6,158,647 A | 12/2000 | Chapman et al. | 228/180.5 |
| 6,239,380 B1 | 5/2001 | Drussel et al. | 174/250 |
| 6,242,271 B1 | 6/2001 | Buhrer et al. | 438/14 |
| 6,245,646 B1 | 6/2001 | Roberts | 438/464 |
| 6,267,167 B1 | 7/2001 | Chapman | 156/433 |
| 6,281,044 B1 | 8/2001 | VanNortwick | 438/111 |
| 6,303,470 B1 * | 10/2001 | Ohsumi et al. | 438/113 |
| 6,311,890 B1 | 11/2001 | Chapman et al. | 228/180.5 |
| 6,321,739 B1 | 11/2001 | Roberts | 125/35 |
| 6,329,832 B1 | 12/2001 | Cobbley et al. | 324/765 |
| 6,336,973 B1 | 1/2002 | Moden et al. | 118/406 |
| 6,346,152 B1 | 2/2002 | Moden et al. | 118/422 |
| 6,368,897 B1 | 4/2002 | Jiang et al. | 438/118 |
| 6,369,602 B1 | 4/2002 | Cobbley et al. | 324/765 |
| 6,397,715 B1 | 6/2002 | Roberts | 83/149 |
| 6,439,450 B1 | 8/2002 | Chapman et al. | 228/180.5 |
| 6,440,777 B2 | 8/2002 | Cobbley et al. | 438/118 |
| 6,472,901 B2 | 10/2002 | Cobbley et al. | 324/765 |
| 6,485,778 B1 | 11/2002 | Moden et al. | 427/96 |
| 6,521,287 B2 | 2/2003 | Jiang et al. | 427/143 |
| 6,537,400 B1 | 3/2003 | Fogal et al. | 156/64 |
| 6,544,803 B2 | 4/2003 | Buhrer et al. | 438/14 |
| 6,545,498 B2 | 4/2003 | Cobbley et al. | 324/765 |
| 2001/0012680 A1 | 8/2001 | Cobbley et al. | 438/584 |
| 2002/0058396 A1 | 5/2002 | Roberts et al. | 438/460 |
| 2002/0124623 A1 | 9/2002 | Roberts et al. | 72/375 |

\* cited by examiner

US 6,744,134 B2

1

USE OF A REFERENCE FIDUCIAL ON A SEMICONDUCTOR PACKAGE TO MONITOR AND CONTROL A SINGULATION METHOD

CROSS-REFERENCE TO RELATED APPLICATIONS

This application is a division of U.S. pat. application Ser. No. 09/653,473, filed Aug. 31, 2000.

FIELD OF THE INVENTION

The present invention relates generally to the preparation of semiconductor packages. In one aspect, the invention relates to singulation of a plurality of interconnected semiconductor packages into separate semiconductor packages. In another aspect, the invention relates to singulation of semiconductor packages using a reference fiducial, and more particularly, to the use of a reference fiducial to control and monitor singulation of a semiconductor package.

BACKGROUND OF THE INVENTION

Chips that are to be used in a circuit or electronic product typically have metal interconnects that are fragile and thin (often on the order of 1.5 $\mu$m in thickness or less). As such, chips are typically attached to a semiconductor package. Packages permit the chip to be connected to a printed circuit board (PCB). Packages also serve to prevent chip breakage and contamination (for example, from substances such as sodium, chlorine and the like), and provide protection from shock and harsh environmental effects, such as moisture. Finally, and perhaps most significantly, packages serve to dissipate heat. In short, packages serve many important and varied functions, and thus, great care must be given to ensure their proper preparation.

Packages must be produced efficiently. Typically, substantial savings of time and money can be achieved in the production of semiconductor packages by handling a plurality of such packages while they are still interconnected as an elongated panel (also called a "package panel").

While packages are often attached to one another when handled, they typically function or are otherwise used individually. As such, any panel of interconnected packages must be singulated (i.e., separated) into individual packages. A variety of processes exist to singulate such package panels into individual packages. Exemplary processes include: shearing, routing, break-away methods using, for instance, routed tabs as described below, scoring, perforation, dicing, sawing and various punch and die techniques.

A variety of package types exist for connecting chips to a PCB. A dual in-line package (DIP) is probably the most common design. Other packages can be used as well, including, for example: quad packages, thin packages, chip-scale packages, pin grid array packages, and ball grid array (BGA) packages. Packages typically include a chip/package connection area to permit the chips to be connected to the lead system of a package via such items as bonding wires, pads, or a series of balls. Selection of the appropriate package depends on a variety of factors. Yet, as electronic devices and the chips that drive their function become more complex, so too must packages increase in their complexity, in order to accommodate such chips.

Ball Grid Array packages are one type of package that can house complex chips. As such, for purposes of this application, "package" shall refer to a Ball Grid Array (or BGA) package. However, it is understood that any package

2 capable of accommodating a similarly complex chip is within the scope of the invention. As the name indicates, a BGA package uses a series of metal solder balls or bumps attached to the bottom side of the package to connect the package to a PCB or electronic device. The number (e.g., 50, 60, 100) and arrangement of balls used in an array (e.g., rectangular array) can vary to convenience depending on a variety of factors, for instance, overall chip or package part complexity.

In the past, the balls of a ball grid array itself have been used as a reference for purposes of singulation, both in terms of determining paths of singulation (also referred to herein, when use in the context of a sawing-type singulation, as "saw streets"). More Specifically, it has been a standard in industry to utilize the balls (or the ball pads to which they are attached) of a ball grid array as a means of comparison vis-a-vis the edge of the package (also called the "ball to edge" standard). In this way, the "ball to edge" standard comparison or test has been used to ensure that overall singulation quality characteristics, for example, edge straightness, precision, accuracy, and ball to edge (or ball pad to edge) offset, are being achieved.

Unfortunately, the balls of the ball grid array can melt or otherwise deform during, for example, package preparation processes. Further, the balls typically tend to stick to the bonding pads, and further still, they tend to deform, then taking on an almost oval or "egg-like" shape. In addition, when the balls are joined to their corresponding ball pads, the ball pads are no longer visible for purposes of control or monitoring. Complicating matters further, the balls can be misplaced ever so slightly, resulting in an inaccurate reference point from which to measure package singulation quality characteristics (again, for instance, edge straightness) within, of course, certain pre-determined tolerance levels. Finally, since balls serve primarily to connect the chip to the PCB, a function wholly separate from singulation, ball placement cannot be adjusted for purposes of singulation alone.

Accordingly, there is a need in the semiconductor industry to provide a singulation method that ensures the production of high quality, precisely sized and shaped, and highly dependable packages, packages having requisite singulation quality characteristics, and the method achieved in a cost-effective and easily-reproducible manner.

SUMMARY

In accordance with one embodiment of the invention, disclosed herein is a semiconductor package panel singulation method using a reference fiducial, the method comprising the steps of:

providing a semiconductor package panel comprising a plurality of interconnected semiconductor packages, at least one of the packages having a reference fiducial formed thereon;

singulating a semiconductor package panel along a path of singulation; and using the reference fiducial formed on the at least one package to monitor and control the singulating of the semiconductor package panel along the path of singulation.

In accordance with another embodiment of the invention, disclosed herein a semiconductor package panel singulation process using a reference fiducial, the process comprising the steps of:

providing a semiconductor package panel comprising a plurality of interconnected semiconductor packages, at least one of the packages having a reference fiducial formed thereon;

singulating a semiconductor package panel; and using the reference fiducial formed on the at least one package to monitor and control the singulating of the semiconductor package panel;

wherein the steps of singulating the panel and using the reference fiducial are performed substantially simultaneously.

In still another embodiment of the invention, a semiconductor package singulation method is disclosed, the method comprising the step of:

using at least a portion of a reference fiducial formed on at least one package in a semiconductor package panel comprising a plurality of interconnected packages, the fiducial used to monitor and control the semiconductor package singulation method.

In yet still another embodiment of the present invention, a singulation method is disclosed, the method comprising the steps of:

providing a semiconductor package panel having interconnected first and second semiconductor packages;

forming a reference fiducial on at least one of the semiconductor packages;

singulating the package panel into singulated semiconductor packages; and using the reference fiducial to monitor at least one of a plurality of singulation quality characteristics.

In still another embodiment of the present invention, a fiducial for a singulation method is disclosed, the fiducial comprising:

a metal strip placed on a semiconductor package panel, the package panel comprising a plurality of interconnected semiconductor packages and a support substrate for supporting the metal strip;

wherein the fiducial is structured to ascertain and verify one or more singulation quality characteristics.

In still yet another embodiment of the present invention, a semiconductor package singulation method is disclosed, the method comprising the steps of:

providing a semiconductor package panel, the semiconductor package panel comprising a support substrate for supporting a plurality of interconnected semiconductor packages thereon, at least one of the plurality of packages having at least one reference fiducial formed thereon;

singulating the package panel along at least one singulation path; and adjusting the at least one singulation path with respect to the at least one reference fiducial.

BRIEF DESCRIPTION OF THE DRAWINGS

Preferred embodiments of the invention are described below with reference to the following accompanying drawings, which are for illustrative purposes only. In the Figures, like numbers are employed to designate like parts or steps throughout the same.

FIG. 2 is an enlarged detailed bottom view of an individual BGA semiconductor package portion as shown in FIG. 1.

DETAILED DESCRIPTION OF THE PREFERRED EMBODIMENTS

The present invention shall be generally described with reference to FIGS. 1–5. With the description provided below, it should be apparent to one skilled in the art that the various structures and methods described in conjunction with the Figures can be used in a variety of combinations and configurations. Further, it should apparent that the scaling in the Figures does not represent precise dimensions of the various elements illustrated therein. Finally, various items of equipment, as well as their fittings, fasteners and the like, have been omitted so as to simplify the description. However, those skilled in the art will realize that such conventional items for use therewith can be employed as desired.

It should also be readily apparent to one skilled in this art that whenever reference is made to a semiconductor package in the following description, various process steps may have been previously utilized to control and monitor a singulation for singulating a plurality of interconnected packages into separate packages.

By way of introduction, packages (including BGA packages) typically are supported by a substrate material. In this application, "substrate material", or simply a "substrate", refers to any suitable core semiconductor package substrate material (e.g., fiber glass, various ceramics, an FR4 PCB, resins, and the like) known to one skilled in the art of making semiconductor packages. The substrate can comprise a glass weave impregnated with a resin system and can have a variety of thicknesses and glass weave configurations. One suitable material is a resin manufactured by Mitsubishi Chemical and is sold under the trade name "BT". As it pertains to singulation, "substrate" refers to any material that can be cut or otherwise singulated (again, i.e., separated) in a manner consistent with the invention, for instance, by sawing or routing.

Figure 1:
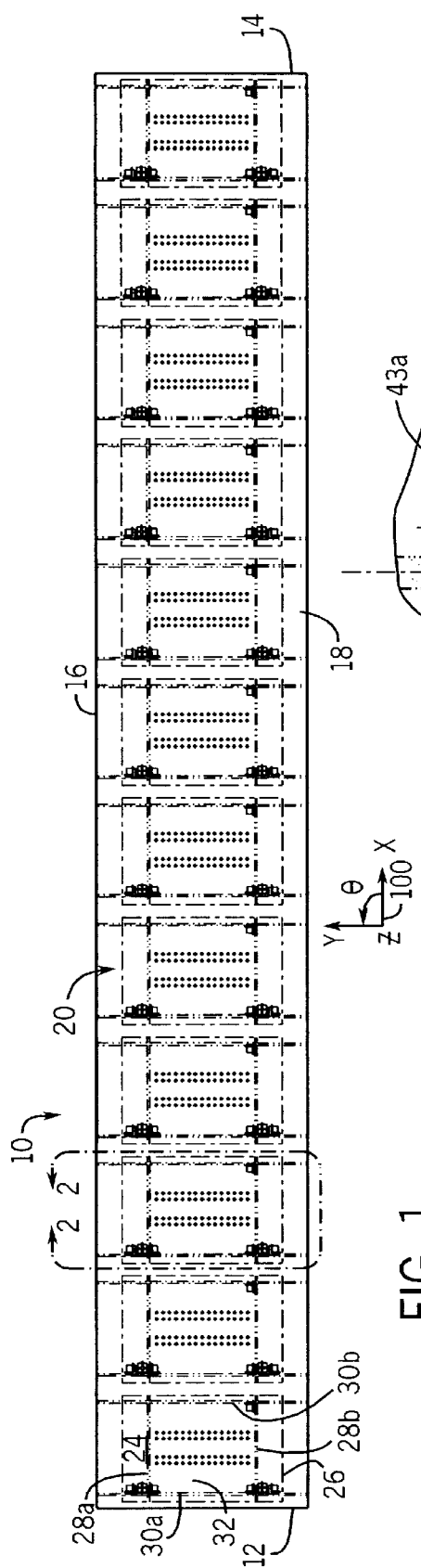
FIG. 1 is a bottom view of an illustrative panel of interconnected Ball Grid Array (BGA) semiconductor packages in accordance with the present invention.

Referring to FIG. 1, a bottom view of a preferred embodiment of a panel of interconnected packages 10 is shown. The semiconductor package panel 10 comprises an elongate, generally planar and rectangular-shaped supporting substrate 11 (see FIG. 5) having a bottom surface 20 and a top surface 19 (see FIG. 5). The panel itself comprises a plurality (e.g., 12, as shown) of packages 32. For a given production run, a package panel 10 can comprise any number of substantially identical packages, such as, forty, sixty, or more.

FIG. 2 illustrates an enlarged view of one package portion 24 (i.e., one of the twelve substantially identical package portions). Package portion 24 is delineated by dashed line 26 (both shown in reduced size in FIG. 1). FIG. 2 also shows a typical bump or ball grid array pattern for a particular BGA semiconductor package (i.e., a JEDEC standard pinout package) which includes balls 22 on the bottom surface 20 of the package panel 10. Again, bumps or balls 22 are typically connected to circuit components by interconnection circuitry to form complete circuits. The number of balls can vary to convenience, and generally depends on a variety of factors (e.g., the particular die type to be attached, memory configuration, for instance, 16 MG, 64 MG, and 256 MG, and memory type, for instance, SRAM, and DRAM).

Referring to FIGS. 1 and 2, the package panel extends longitudinally between a first end 12 and a second end 14. The package panel further has a first edge 16 and a second edge 18 extending between the first end 12 and the second end 14. Each package 32 has a substantially rectangular perimeter, delineated by line 34 as shown (described further below).

Again, a variety of methods can be used to singulate a given package panel into individual packages. Of course, any package singulation process must account for, so as not harm or destroy, the "key features" of the packages being singulated (e.g., lead systems, bond pads, traces, and the like). Routing, for instance, can be performed to route slots in the substrate panel so as to define a perimeter around individual semiconductor packages. Typically, routing leaves spaced support tabs (not shown) around a package's perimeter. These tabs hold a package in place. Later, the tabs can be broken or cut to separate the package from a package panel.

In another process, an individual package 32 can be separated from a package panel 10 by sawing the package panel 10 into discrete packages 32. Here, a finished package 32 will often have a substantially rectangular perimeter as shown (again, delineated in FIG. 2 by solid line 34) that can be obtained by singulating along two substantially mutually perpendicular sets of substantially parallel singulation (also called cut or separation) paths. In general, the width of a cut path can be substantially equal to the width of the material removal tool. If the material removal tool is a saw blade, such singulation paths are called "saw streets."

Referring to FIGS. 1 and 2, opposing, substantially horizontal singulation paths 28a, b and opposing, substantially vertical singulation paths 30a, b are shown as dashed lines. For purposes of clarity, it is noted here again that each package 32 has a substantially rectangular perimeter that is shown in solid lines 34. Singulation paths 28a, b extend from first end 12 to second end 14 of package panel 10. Singulation paths 30a, b extend vertically between first edge 16 and second edge 18 of package panel 10.

The singulation methods described herein and in accordance with the present invention require a dicing system that can include a substrate holding apparatus (not shown), a material removal tool of the kind noted above, for example, a rotating saw blade, router, scribe, and the like (also not shown), and a vision system (e.g. a pattern recognition system of the kind described in greater detail below). The substrate holding apparatus can include a number of clamping members, for instance, vacuum chucks (not shown) for holding and orientating the panel 10 of semiconductor BGA packages 32 in fixed position during singulation of the panel into individual packages 32. One example of a dicing system for use in the present invention is sold under the tradename EAD 691, available from Disco.

In addition, the substrate holding apparatus can permit movement (preferably motor-driven, or otherwise automated movement) of the panel 10 of packages 32 in an x, y, or z direction, represented generally by arrows 100, (shown in FIG.1, but applicable to all Figures illustrating a package herein). Rotation of the panel through an angle theta (θ) is also preferably permitted. Optionally, the apparatus can provide for movement and rotation of the material removal device itself.

It should be readily apparent to one of skill in the art that there are factors that affect the selection of the particular substrate holding apparatus. These can include, but are not limited to, the choice of substrate material (again, for instance, an FR4 board, BT resin, among others), the ultimate package size and/or geometry, and the type of cutting operation being performed (routing, scoring, sawing, and the like).

Any particular material removal tool capable of removing material as described in this application may be utilized in accordance with the present invention. Accordingly, the material removal tool too can vary to convenience. Preferably, the material removal tool is a numerically-controlled saw blade. One exemplary saw includes a rotating blade mounted to a hub and attached to a rotating spindle, the spindle being connected to a motor (not shown). The cutting action of the blade can be effected by using a diamond-particle saw blade, the blade similar to that used to separate wafers during a "dicing" procedure. Traditional "toothed" blades may be used as well. Such blades and saws are common and well-known within the art, and the present invention is applicable to any such commonly-used saws. One example of a saw blade for use in conjunction with the dicing system is a diamond saw blade sold under the tradename Diamond Dicing Blade, available from Micro-Swiss, a division of K&S.

Preferably, the saw blade contemplated for use with the invention as disclosed herein can operate in conjunction with a pattern recognition system (also not shown). One such pattern recognition system is an optical vision system that (using a camera and a computer system comprising a memory medium having a computer program coded thereon) recognizes a particular singulation pattern (the pattern comprising a plurality of singulation paths) on, for instance, the panel of packages. The system, in essence, can direct the saw blade to singulate along a prescribed singulation pattern (for instance, one or more paths) in a controlled manner. In general terms, the system can function to memorize each saw street, in addition to any offsets relative thereto (described further below) so as to obtain a package 32 having the requisite singulation quality characteristics, for example, edge straightness, precision, accuracy, ball to edge (or ball pad to edge) offset.

Figure 3:
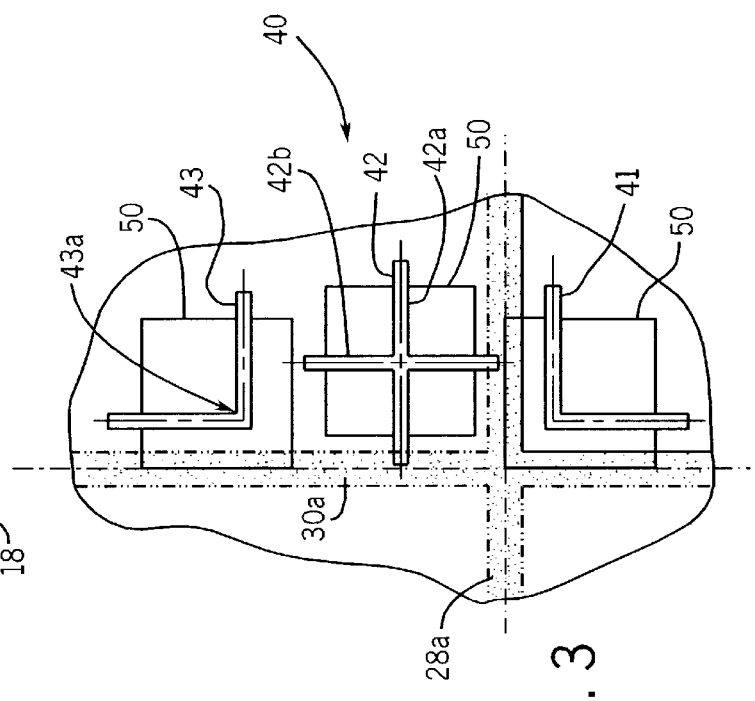
FIG. 3 is an enlarged detailed view of a reference fiducial of an individual package shown in FIG. 1 for use with the present invention.

FIG. 3 illustrates an enlarged view of a preferred embodiment of a fiducial 40 shown for use in the present invention. The term "fiducial" is often used to describe a flat or notch on a semiconductor wafer that is oriented with respect to a specified crystal plane and used for orientation or alignment of the wafer during device or circuit processing. FIGS. 1–3 show first, second, and third fiducials 40, 44, and 48 as they are formed for use on a package panel 10 in a singulation method, the fiducials typically being formed in a repetitive pattern. Fiducials generally provide an efficient and easily produced reference point.

Figure 5:
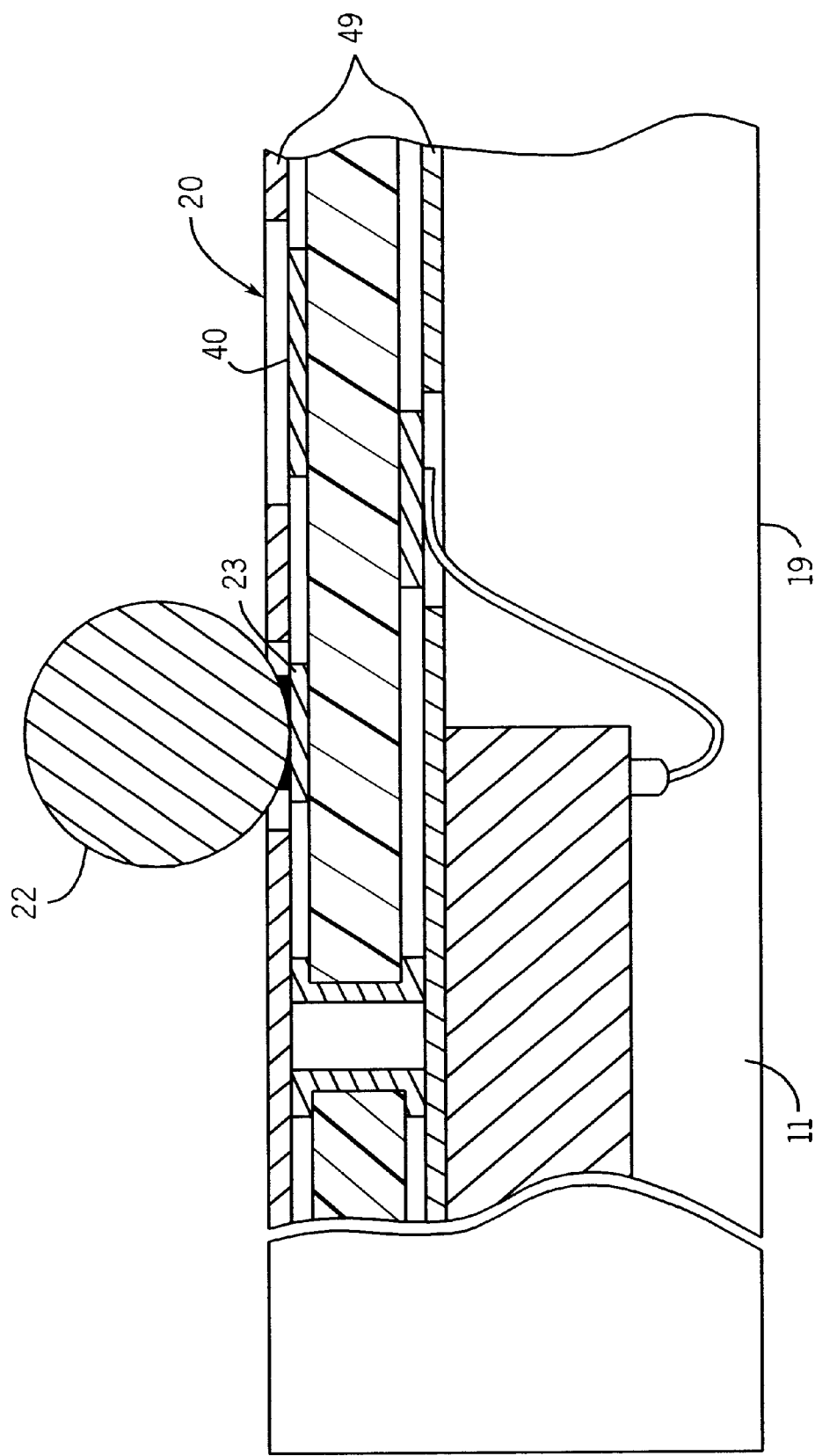
FIG. 5 is a cross-sectional side view of a BGA semiconductor package illustrating a solder ball, fiducial, ball pad, and package edge.

FIG. 5 illustrates a cross-section of a ball grid array having a fiducial formed thereon. One method of forming a fiducial for use in the present invention is as follows. The package supporting substrate 11 is laminated on both the top surface 19 and bottom surface 20 (shown in all Figures showing a package) with a copper, or other metal clad foil (a.k.a. "CCF" for "copper clad foil"). For purposes of clarity, the CCF is not numbered since the individual elements (e.g., fiducial, ball pads, etc.) are made from copper (or other metal) and are separately identified.

The CCF is laminated by applying temperature and pressure (i.e., it can be pressure molded) across the substrate. The foil layer can be manufactured to have a variety of thicknesses, however, preferably a copper layer having about 20 µm thickness is utilized. As suggested above, components or other key package features (e.g., bond pads, ball pads, traces, etc.,) including any fiducials are created using a subtractive process after the CCF is laminated to the substrate. The subtractive process uses a dry film that can be applied to the copper clad laminate (CCL). The dry film can then exposed and developed. The dry film can then removed where the subtractive process is to take place or, alternatively stated, the dry film can then be left on the CCL where key package features or circuitry are desired. The CCL and dry film are processed through a etching process where the exposed copper is removed. Finally, the dry film can be removed leaving the circuitry, that is, any key features (including fiducials) exposed.

Subsequent processes are also done, including soldermask layer 49 application, nickel/gold (Ni/Au) plating, routing, and drilling. For purposes of this application, the soldermask application will be described further. A translucent resin, or soldermask, layer 49 can be applied over an entire package surface area. A photo resist can then be preferably applied corresponding to soldermask layer 49 areas that are to remain on the package. An etching process can then used to expose or remove any area not covered by the photo resist, thereby creating a soldermask opening 50. During a singulation method, a fiducial 40 (or portion thereof) can then be exposed so as to be "seen" by a pattern recognition system of the kind described above and a ball and ball pad can be attached for purposes of electrical connection.

Referring to FIGS. 1–3, in one embodiment, fiducial 40 includes three separate portions, namely "L-shaped" portion 41, "cross-shaped" portion 42, and "L-shaped" portion 43. Similarly, and as shown in FIGS. 1 and 2, fiducial 44 comprises "L-shaped" portion 45, "cross-shaped" portion 46, and "L-shaped" portion 47, while fiducial 48 can comprise a single "L-shaped" portion. One of skill in the art would understand that the shape of a fiducial can vary to convenience, depending, for instance, on the method used to prepare them and the particular application or used for which they are intended.

Referring to FIG. 3, in practice, the inside vertex, for instance vertex 43*a* of adjoining "arms" of an "L-shaped" fiducial portion 43 in practice typically has a radius (it is not a perfect corner), which can deleteriously effect the pattern recognition system's capability of "seeing" a fiducial (or portion thereof). As such, fiducials are typically formed to have a certain minimum length so as to be appropriately "seen" by a pattern recognition system. The minimum length of each "arm" of an "L-shaped" fiducial, for instance, is preferably about 0.8 mm, more preferably about 1.0 mm, and most preferably about 1.5 mm. A minimum width of each such arm can be, for instance, preferably about 0.1 mm. Such dimensions thus can achieve a length to width (or aspect) ratio of preferably about 8, more preferably about 10, and most preferably about 15.

As shown in all of the Figures showing a package, and in particular FIGS. 3 and 5 showing a detailed view of fiducial 40, a "soldermask opening", that is, an opening in solder mask layer 49 (shown as a solid perimeter line 50) surrounds each of the fiducial portions. In essence, a soldermask opening is an area having an exposed copper (or other metal) feature (such as, for instance, a fiducial) that is to be void of any covering or masked layer, such as a translucent resin. Significantly, and as shown in FIG. 5, while ball pads 23 are typically not visible after the metallic balls 22 (of the BGA) are placed or otherwise attached on the package substrate, fiducials, if appropriately prepared, can serve as a singulation and alignment feature.

In accordance with one preferred embodiment of the invention, fiducials 40, 44 and 48 are formed and positioned on each of twelve packages 32 connected as a panel 10 as shown in the FIG. 1 (and in detail on FIGS. 2 and 3). At least one package panel 10 is then secured via a chuck (e.g. a vacuum chuck) or other clamping fixture on a table in the substrate holding apparatus described previously.

Referring to FIGS. 1–3, the saw, or other appropriate material removal device (not shown), can begin the removal process by aligning itself with fiducial 44 (using a pattern recognition system capable of "seeing" or "reading" the fiducial) as referenced above. More particularly, the removal device can align with "cross-shaped" fiducial portion 42, and even more particularly it can align with the horizontal portion 42*a* of fiducial portion 42. Next, the removal device can index across (as shown, in a negative "y" direction, arrow 100) the package panel about, for instance, about 70% of the length of the panel measured from top edge 16 to align with fiducial 44. More particularly, the removal device can align with "cross-shaped" fiducial portion 46, and even more particularly, it can align with the horizontal portion 46*a* of fiducial portion 46. Typically, any aligning (or subsequent monitoring) measures from a centerline of a fiducial (or portion thereof).

Significantly, the reference fiducials (or any portions) are not placed so as to overlay, or intersect, with the singulation paths (or saw streets) 28*a, b* and 30*a, b*, but rather, the fiducials are preferably offset from the saw streets. As such, any appropriate pattern recognition can account for this offset prior to any singulation (i.e., separation) process. For instance, as shown in FIG. 3 in one embodiment, substantially horizontal singulation path 28*a* (shaded area) is offset approximately 0.8 mm from the centerline (shown in dashed lines) of the vertical portion 42*a* of fiducial portion 42.

Still referring to FIGS. 1–3, having appropriately read and located the positions of the fiducials (using a pattern recognition system), the substrate holding apparatus table is then appropriately rotated through an angle theta (θ)=90° (or negative 90°) (see FIG. 1, coordinates 100) so as to achieve singulation alignment in the "y" direction (coordinates 100). To achieve such alignment, the saw blade or other material removal device is aligned once again with a fiducial. More particularly, the blade can align with "cross-shaped" fiducial portion 42, and even more particularly, it can align with the vertical portion 42*b* of fiducial portion 42 since any cut aligned from this point will be in the "y" or "negative y" direction (coordinates 100). Again, any offset is accounted for by the pattern recognition system used. As depicted by FIG. 3, in one embodiment, saw street 30*a* (shaded area) is offset approximately 0.8 mm from the centerline (shown in dashed lines) of the vertical portion 42*b* of fiducial portion 42.

Following alignment as described above, singulation of the package panel 10 can occur. For purposes of this embodiment, namely, a package panel 10 having twelve identical interconnected packages 32, a specific singulation procedure can 24 occur. Of course, this procedure (including the number of cuts, the ordering of cuts, and so forth) can vary to convenience. In one preferred embodiment, a saw comprising six blades is used to singulate three packages simultaneously in the "y" (or "negative y") direction (arrow 100) along saw streets 30*a, b* from first edge 16 to second edge 18 on each package 32. After each pass, the package panel 10 is appropriately indexed in the x (or negative x) direction (coordinates 100) so as to simultaneously singulate three additional packages from the package panel. In all, four passes can be made to successfully singulate all twelve of the packages 24. Of course, the number of blades utilized can vary as desired. Next, the table can be again rotated through an angle theta (θ)=90° (or negative 90°) degrees (arrow 100) and indexed as desired in the x (or negative x) direction. Finally, the package panel can be singulated along saw streets 28*a, b*. Preferably, a saw comprising two blades can be used to singulate the package panel in one continuous pass from first end 12 to second end 14 along the longitudinal saw streets 28*a, b*.

Figure 4:
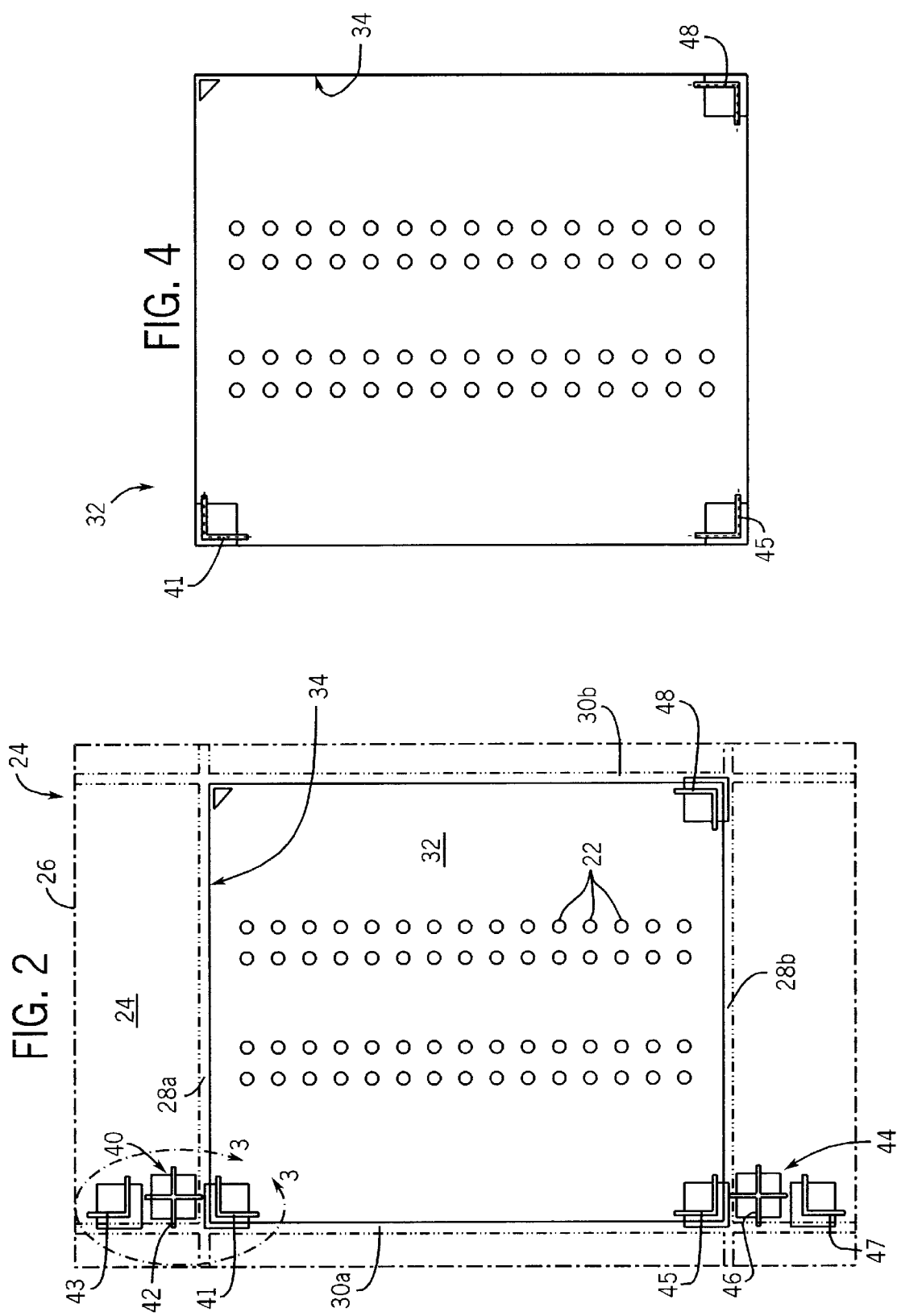
FIG. 4 is an enlarged detailed view of a singulated BGA semiconductor package having portions of the reference fiducial shown in FIGS. 1–3 located thereon.

FIG. 4 illustrates a separate singulated package 32 defined by perimeter 34. As shown, "L-shaped" fiducial portions 41, 45, and 48 remain on the package following the singulation process. These fiducials (or portions thereof) are used to control and monitor the overall accuracy of the singulation process. For instance, in one preferred embodiment, the offset distances between the center lines of reference fiducial portions 41, 45, and 48 (not shown) and each package edge (shown generally as perimeter line 34) can be observed and compared for accuracy. To accomplish such confirmation of these and other singulation quality characteristics, again, for example, edge straightness, accuracy and ball to edge (or ball pad to edge) offset, a separate, offline measuring apparatus can be used.

In one example, the apparatus can be utilized to determine whether appropriate tolerance levels have been achieved. And in one preferred embodiment, a tolerance level is within about ±0.2 mm of a desired amount, more preferably within about ±0.1 mm of a desired amount, and most preferably, within about ±0.05 mm of a desired amount. If such desired tolerance levels (or other singulation quality characteristics) are not achieved, singulation can be adjusted accordingly. In general, it should be noted that such monitoring and control of singulation methods can take place as singulation occurs.

In another preferred embodiment of the present invention, a fiducial (for instance, fiducial 40) can comprise a single portion, including a single "L-shaped" fiducial portion. This single portion can be appropriately placed on the interconnected packages 32 of the package panel 10 so as to remain on the package following a singulation process. More specifically, the fiducial can comprise portions 41, 45 and 48 as shown in FIG. 2.

Any monitoring or controlling of a singulation process taking place herein can take place substantially simultaneously with the singulation (i.e., separation) itself. In addition, it should be understood that a "singulation process", as used herein, is applicable or can refer to a single cut (or other separation) or plurality of cuts (or other separations).

Where this invention has been described with reference to illustrative embodiments, this description is not meant to be construed in a limiting sense. Various modifications and additions can be made to the illustrative embodiments described herein. Further, there can be other embodiments of the invention. Such will be apparent to those persons who are skilled in the art upon reference to this description. It is contemplated that the appended claims will cover any such modifications and/or embodiments as fall within the scope of the present invention as defined by the accompanying claims.

What is claimed is:

1. A fiducial for a singulation method, the fiducial comprising:
   a metal strip that is one of L-shaped and cross-shaped placed on a semiconductor package panel, the package panel comprising a plurality of interconnected semiconductor packages and a support substrate for supporting the metal strip;
   wherein the metal strip is structured for use in ascertaining and verifying one or more singulation quality characteristics; and
   wherein the reference fiducial portions are positioned on the semiconductor package panel offset from so as not to intersect, any paths of singulation.

2. The fiducial of claim 1 wherein the one or more singulation quality characteristics include at least one of: edge straightness, accuracy, ball to edge offset and ball pad to edge offset.

3. A reference fiducial for use as a singulation feature on a semiconductor package panel comprising a plurality of interconnected semiconductor packages, the fiducial comprising:
   a first L-shaped fiducial portion formed on the semiconductor package panel;
   a second cross-shaped fiducial portion formed on the semiconductor package panel; and
   a third L-shaped fiducial portion formed on the semiconductor package panel;
   wherein at least one of the fiducial portions can be used to singulate the semiconductor package panel.

4. The reference fiducial of claim 3 wherein the first L-shaped fiducial portion comprises arms having an aspect ratio of at least about 8.

5. The reference fiducial of claim 3 wherein the first L-shaped fiducial portion comprises arms having an aspect ratio of at least about 10.

6. The reference fiducial of claim 3 wherein the first L-shaped fiducial portion comprises arms having an aspect ratio of at least about 15.

7. The reference fiducial of claim 3 wherein the third L-shaped fiducial portion comprises arms having an aspect ratio of at least about 8.

8. The reference fiducial of claim 3 wherein the third L-shaped fiducial portion comprises arms having an aspect ratio of at least about 10.

9. The reference fiducial of claim 3 wherein the third L-shaped fiducial portion comprises arms having an aspect ratio of at least about 15.

10. A reference fiducial for use as singulation feature on a semiconductor package panel comprising a plurality of interconnected semiconductor packages, the fiducial comprising:
    a first fiducial portion formed on the semiconductor package panel;
    a second fiducial portion formed on the semiconductor package panel; and
    a third fiducial portion formed on the semiconductor package panel;
    wherein at least one of the fiducial portions can be used to singulate the semiconductor package panel;
    wherein the first second, and third fiducial portions are at least one of L-shaped and cross-shaped; and
    wherein the reference fiducial portions are positioned on the semiconductor package offset from, so as not to intersect any paths of singulation.

11. The reference fiducial of claim 10 wherein the first fiducial portion is L-shaped.

12. The reference fiducial of claim 10 wherein the second fiducial portion is cross-shaped.

13. The reference fiducial of claim 10 wherein the third fiducial portion is L-shaped.

14. A reference fiducial for use as a singulation feature on a semiconductor package panel comprising a plurality of interconnected semiconductor packages, the fiducial comprising:
    a first L-shaped fiducial portion formed on the semiconductor package panel;

wherein the fiducial portion can be used to singulate the semiconductor package panel; and wherein the reference fiducial portion is positioned on the semiconductor package panel offset from so as not to intersect any paths of singulation.

15. The reference fiducial of claim 14 wherein the reference fiducial comprises a second cross-shaped fiducial portion formed on the semiconductor package panel.

16. The reference fiducial of claim 14 wherein the reference fiducial comprises a third L-shaped fiducial portion formed on the semiconductor package panel.

17. The reference fiducial of claim 14 wherein at least one of the reference fiducial portions remains on the package panel following a singulation.

18. A reference fiducial for use as a singulation feature on a semiconductor package panel comprising a plurality of interconnected semiconductor packages, the fiducial comprising:
 a first L-shaped fiducial portion formed on the semiconductor package panel;
 a second cross-shaped fiducial portion formed on the semiconductor package panel; and
 a third L-shaped fiducial portion formed on the semiconductor package panel.

19. The reference fiducial of claim 18 wherein the first fiducial portion and the third fiducial portion each comprises first and second arms and wherein the second fiducial portion comprises four arms.

20. The reference fiducial of claim 19 wherein the first and second arms of at least one of the first and third fiducial portions are substantially perpendicular to each other.

21. The reference fiducial of claim 19 wherein the arms of the second fiducial portion have an aspect ratio of at least about 8.

22. The reference fiducial of claim 18 wherein the semiconductor package panel comprises twelve (12) interconnected semiconductor packages.

23. A reference fiducial in combination with a semiconductor package panel, the fiducial for use as a singulation feature, the combination comprising:
 a semiconductor package panel comprising a plurality of interconnected semiconductor packages; and
 a reference fiducial comprising:
  a first L-shaped fiducial portion formed on the semiconductor package panel;
  a second cross-shaped fiducial portion formed on the semiconductor package panel; and
  a third L-shaped fiducial portion formed on the semiconductor package panel;
wherein at least one of the fiducial portions can be used to singulate the semiconductor package panel.

24. The reference fiducial of claim 18 wherein the reference fiducial portions are positioned on the at least one of the semiconductor packages offset from, so as not to intersect, a path of singulation by an offset amount measured from an edge of the path to a centerline of one of the fiducial portions.

25. The reference fiducial of claim 18 wherein only one of the reference fiducial portions is positioned so as to remain on at least one of the semiconductor packages following a singulation.

* * * * *

UNITED STATES PATENT AND TRADEMARK OFFICE
CERTIFICATE OF CORRECTION

PATENT NO. : 6,744,134 B2
DATED : June 1, 2004
INVENTOR(S) : Jay Roberts et al.

It is certified that error appears in the above-identified patent and that said Letters Patent is hereby corrected as shown below:

Title page,
Item 75, Inventors, add -- Walter L. Moden, Boise ID -- and -- Tom A. Muntifering, Boise, ID --

Column 10,
Line 54, add -- panel -- after "package".

Signed and Sealed this

Thirty-first Day of August, 2004

JON W. DUDAS
*Director of the United States Patent and Trademark Office*